United States Patent [19]

Hall et al.

[11] 4,277,697

[45] Jul. 7, 1981

[54] DUTY CYCLE CONTROL APPARATUS

[75] Inventors: George R. Hall, Sherman Oaks; Robert J. Hall, Chatsworth, both of Calif.

[73] Assignee: Norlin Industries, Inc., White Plains, N.Y.

[21] Appl. No.: 3,585

[22] Filed: Jan. 15, 1979

[51] Int. Cl.³ .................... H03K 5/26; H03K 3/017
[52] U.S. Cl. .................................. 307/265; 328/58; 328/146; 307/358
[58] Field of Search ............... 328/146, 58; 307/265, 307/358

[56] References Cited

U.S. PATENT DOCUMENTS

| | | | |
|---|---|---|---|
| 3,484,624 | 12/1969 | Raisel et al. | 307/265 |
| 3,489,921 | 1/1970 | Mietz et al. | 328/146 X |
| 3,800,167 | 3/1974 | Smith | 307/265 |
| 3,952,213 | 4/1976 | Fukaya | 307/265 |
| 3,988,618 | 10/1976 | Munden et al. | 307/265 X |
| 3,991,323 | 11/1976 | Przybylski | 307/265 |

*Primary Examiner*—John S. Heyman
*Attorney, Agent, or Firm*—Allegretti, Newitt, Witcoff & McAndrews

[57] ABSTRACT

Apparatus for controlling the duty cycle of a rectangular input signal so that the duty cycle normally remains constant irrespective of the frequency of the input signal, but can be adjusted with accuracy. A generator initiates a rectangular output signal in synchronism with the input signal. A comparator enables the generator to terminate the output signal after a time period related to the relative amplitudes of the output signal and another reference voltage. An adjustment transistor can adjust the amplitude of the reference voltage in order to control the overall duty cycle of the output signal.

11 Claims, 2 Drawing Figures

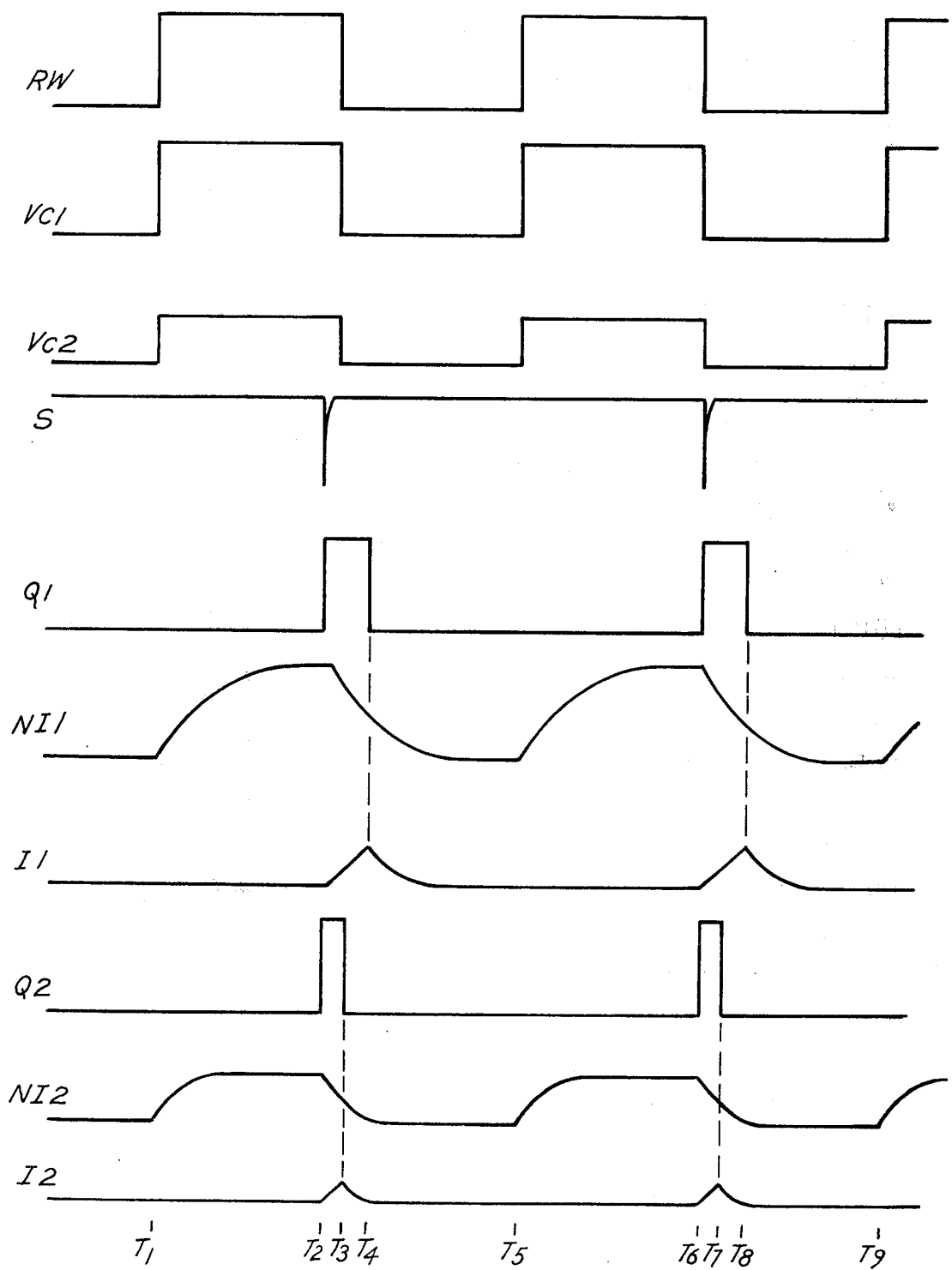

DUTY CYCLE CONTROL APPARATUS

BACKGROUND AND SUMMARY OF THE INVENTION

This invention relates to electronic control circuitry and more particularly relates to apparatus for controlling the duty cycle of a signal.

Manufacturers of electronic musical instruments have long sought a means of accurately adjusting the duty cycle of a tone generator used to create different types of orchestral sounds requiring different harmonic spectrums. For example, experience has shown that a tone signal with a 50% duty cycle is useful for producing a clarinet-type sound and a tone signal with a 12.5% duty cycle is useful for producing a string-type sound. One musical instrument capable of using such a circuit is described in detail in the copending application of the present applicant, as well as George R. Hall and Jack C. Cookerly, entitled "Orchestral Accompaniment Techniques", which is incorporated by reference.

Accordingly, it is an object of the present invention to provide a circuit for accurately controlling the duty cycle of an input signal irrespective of changes of frequency of the input signal.

Another object of the invention is to provide a circuit of the foregoing type which is capable of accurately adjusting the duty cycle of the resulting output signal with respect to the input signal.

Still another object of the invention is to provide a circuit of the foregoing type in which the components are arranged to avoid changes in the duty cycle due to changes in conditions, such as temperature and component values.

DESCRIPTION OF THE DRAWINGS

These and other objects, advantages, and features of the present invention will hereafter appear for purposes of illustration, but not of limitation, in connection with the accompanying drawings wherein like numbers refer to like parts throughout and wherein:

FIG. 2 is an diagram illustrating voltage wave forms produced by the like-lettered portions of the circuit shown in FIG. 1.

DESCRIPTION OF THE PREFERRED EMBODIMENT

Figure 1:
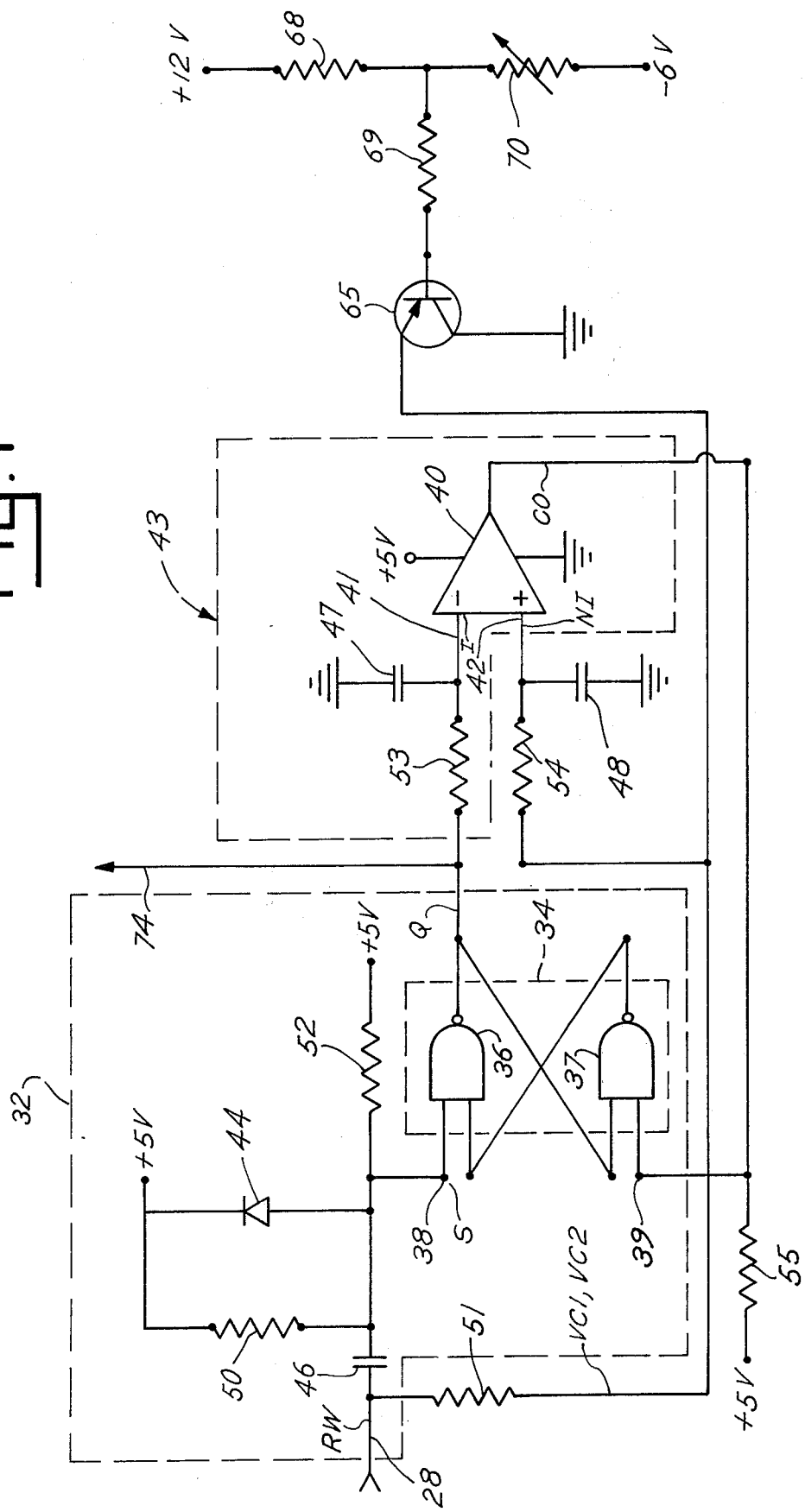
FIG. 1 is an electrical schematic drawing of a preferred form of duty cycle control circuit made in accordance with the present invention.

Referring to FIG. 1, a preferred form of duty cycle control circuit comprises a generator circuit 32 which includes a flipflop 34 consisting of NAND gates 36, 37, a set input 38 and a reset input 39. The flipflop acts as a pulse generator which controls the duration of the rectangular output pulses transmitted over conductor 74. The rectangular input signal from conductor 28 is differentiated by a capacitor 46 and a resistor 50, and the positive pulse resulting from the differentiation is removed by a diode 44. An additional resistor 52 is connected as shown.

An integrating circuit comprising resistors 51, 53 and a capacitor 48 generates a reference signal with an ampitude related to the period of the input signal on conducter 28.

A comparator circuit 43 includes an operational amplifier 40 having an inverting input 41, a non-inverting input 42 and an output CO. The inverting input is connected to another integrating circuit comprising resistor 53 and capacitor 47. Another resistor 55 biases the output of operational amplifier 40. Resistors 53, 54 have the same value and capacitors 47, 48 have the same value in order to provide a balanced comparison by amplifier 40.

Referring to FIG. 2, circuit 32 accepts rectangular wave pulses (such as RW) on input conductor 28 and adjusts the width of the pulses before they are transmitted to output conductor 74. The input rectangular wave is differentiated by capacitor 46 and resistor 50, and the positive pulse resulting from the differentiation is removed by diode 44. The remaining negative pulse is transmitted to set input 38 which forces the Q output of flipflop 34 to a logical one state at time T2.

During time T1–T2, controlled voltage pulse VC1 is integrated by capacitor 48 and resistor 54 to form reference voltage NI1, thereby forcing the output of opamp 40 to a logical one state. The amplitude of NI1 depends on the period of voltage RW. At time T2, voltage Q1 from the Q output of flipflop 34 begins to be integrated by resistor 53 and capacitor 47, and voltage I1 increases. Also at time T2, voltage NI1 begins to decay because input voltage VC1 has returned to its zero state. At time T4, when the voltage across capacitor 47 equals the voltage across capacitor 48 (i.e., when NI1=I1), the output of opamp 40 is switched to its zero state, thereby resetting flipflop 34 and forcing the Q output to its zero state. The Q output then remains at its zero state until the next negative S pulse is received through capacitor 46.

The width of the resulting output pulse Q on conductor 74 depends upon the time required for the voltage at input 41 to equal the voltage at input 42, which in turn depends on the relative amplitudes of voltages NI1 and Q1. The pulse width varies with the repetition rate of the input pulses, but the duty cycle remains constant.

The duty cycle can be adjusted by changing the level of the controlled rectangular wave VC1 through the operation of transistor 65. Transistor 65 controls the input signal by clamping the peaks of the input rectangular wave at about 0.6 volts about the voltage of the base of transistor 65. The voltage at the base of transistor 65, in turn, can be controlled by adjusting potentiometer 70 which is interconnected with resistors 68, 69 as shown.

The effect of transistor 65 on the operation of circuit 32 is illustrated by waveforms VC2, Q2, NI2 and I2 in FIG. 2. Assuming the voltage on the base of transistor 65 is reduced, voltage VC2 is reduced compared to voltage VC1. Voltage NI2 then is integrated to a reduced value during time period T1–T2. Since voltage NI2 is reduced, it decays to a lower value more quickly than voltage NI1, and NI2=I2 more quickly than NI1=I1. As a result, output Q is returned to its zero state at time T3, earlier than time T4, and a narrower output pulse Q2 results.

The resulting duty cycle is expressed by the formula: Duty %=V1/2V2, where V1=maximum voltage of clamped pulse Vc, and V2=maximum voltage of input pulse RW.

The operation of the duty cycle control circuit is drastically improved by the balanced nature of comparator 43. Absent the balanced comparator feature, changes in the repetition rate of the input pulses would result in changes in the duty cycle of the output pulses. Due to the unique balanced component arrangement of the comparator, the errors due to changes in repetition rate at one of the opamp inputs balances the errors due to changes in repetition rate at the other opamp input, thereby enabling the adjustment of the duty cycle of the output pulses with great accuracy irrespective of the repetition rate of the input pulses. In addition, the balanced comparator arrangement tends to cancel duty cycle errors due to temperature or component value changes.

Those skilled in the art will recognize that the preferred embodiment can be altered and modified without departing from the true spirit and scope of the invention as defined in the accompanying claims.

What is claimed is:

1. Apparatus for controlling the duty cycle of an input signal having a period, said apparatus comprising:
   control means for controlling the amplitude of the input signal;
   means responsive to the controlled input signal for generating a first reference signal having a first amplitude dependent on the period of the controlled input signal;
   generator means for initiating in synchronism with the input signal an output signal having a pre-determined second amplitude; and
   comparator means for enabling the generator means to terminate the output signal after a time period related to the relative amplitudes of the reference signal and the output signal, whereby the duty cycle of the output signal with respect to the input signal remains constant even though the frequency of the input signal changes.

2. Apparatus, as claimed in claim 1, wherein the means for generating the first reference signal comprises an integrating circuit responsive to the input signal.

3. Apparatus, as claimed in claim 1, wherein the generator means comprises:
   a flipflop circuit including a set input, a reset input and an output; and
   means for triggering the set input in synchronism with the input signal.

4. Apparatus, as claimed in claim 3, wherein the means for triggering comprises differentiating means for differentiating the input signal.

5. Apparatus, as claimed in claim 3, wherein the comparator means comprises:
   an amplifier having an inverting input, a non-inverting input and an output;
   a first integrating circuit connected between the inverting input and the output of the flipflop circuit;
   means for connecting the means for generating to the non-inverting input; and
   means for connecting the amplifier output to the reset input of the flipflop circuit.

6. Apparatus, as claimed in claim 5, wherein the means for generating the first reference signal comprises a second integrating circuit responsive to the input signal.

7. Apparatus, as claimed in claim 6, wherein the first and second integrating circuits have like components with identical values.

8. Apparatus, as claimed in claims 1 or 7, wherein the control means comprises clamp means for clamping the input signal.

9. Apparatus, as claimed in claims 1 or 8, wherein the input signal and the output signal both are rectangular waveshape signals.

10. Apparatus, as claimed in claims 1 or 7, wherein the control means comprises means for adjusting the amplitude of the reference signal, whereby the duty cycle of the output signal with respect to the input signal can be adjusted.

11. Apparatus, as claimed in claim 10, wherein the means for adjusting comprises means for adjusting the amplitude of the reference signal by adjusting the amplitude of the input signal.

* * * * *